United States Patent [19]

Voorman

[11] 4,264,975
[45] Apr. 28, 1981

[54] RECEIVER FOR FREQUENCY MODULATED SIGNALS HAVING TWO QUADRATURE CHANNELS

[75] Inventor: Johannes O. Voorman, Eindhoven, Netherlands

[73] Assignee: U.S. Philips Corporation, New York, N.Y.

[21] Appl. No.: 61,717

[22] Filed: Jul. 30, 1979

[30] Foreign Application Priority Data

Aug. 22, 1978 [NL] Netherlands .......................... 7808637

[51] Int. Cl.³ .............................................. H04L 5/12
[52] U.S. Cl. ........................................ 375/94; 375/38; 370/20
[58] Field of Search ....................... 375/39, 78, 80, 91, 375/88, 102, 94; 455/60, 132, 137, 138, 139, 205, 208, 214; 329/110, 124, 112; 370/20

[56] References Cited

U.S. PATENT DOCUMENTS

| | | | |
|---|---|---|---|
| 2,654,025 | 9/1953 | Higgins | 375/91 |
| 3,350,646 | 10/1967 | Graziano et al. | 455/137 |
| 3,815,028 | 6/1974 | Rabow | 455/138 |

*Primary Examiner*—Benedict V. Safourek
*Attorney, Agent, or Firm*—Thomas A. Briody; William J. Streeter; Edward W. Goodman

[57] ABSTRACT

A receiver for frequency modulated channels comprises two phase quadrature channels with synchronous demodulation and low-pass filtering. The object aimed at is to provide a tunable receiver without input filter. The absence of an input filter excludes the use of a limiter and the receiver will then be sensitive to amplitude variations. This problem has been solved by dividing the signals in the receiver in one or two stages by an amplitude factor which is derived from the output signals of the low-phase filters.

3 Claims, 7 Drawing Figures

$J_1 J_3 = J_2 J_4$

RECEIVER FOR FREQUENCY MODULATED SIGNALS HAVING TWO QUADRATURE CHANNELS

BACKGROUND OF THE INVENTION

1. Field of the Invention

The invention relates to a receiver for frequency modulated signals having two quadrature channels. Each channel comprises a synchronous demodulator followed by a low-pass filter and a differentiator. The output signal of each of the low-pass filters is multiplied by the differentiated output signal of the filter of the other channel. The output signals of the multipliers are subtracted from one another. The output signal thus produced is proportional to the frequency difference between the received signals and the reference signal applied to the synchronous demodulators.

In such a receiver filtering of the signals is effected by the low-pass filteres and does therefore not depend on the nominal centre frequency of the received signals. The operating frequency of the receiver is determined by the frequency of the reference signals.

Such receivers can be used for, for example, data transmission over telephone lines by means of FSK.

2. Description of the Prior Art

A receiver of the type defined above is known from U.S. Pat. No. 3,568,067.

The omission of a tuned input filter also has its drawback. In the first plate it renders the use of a limiter in the input stage of the receiver impossible. Harmonics of channels of a lower frequency, which come close to the reference frequency would then also be received, which is unwanted. Furthermore strong neighbouring channels may push away a desired weaker channel (the limiter favours the stronger channel). In the second place harmonics of the reference signal enable also the reception at other frequencies. This drawback can be reduced by using a very pure (having a low harmonic content) sinusoidal oscillation for the reference signal.

The absence of a limiter is experienced in particular in links having a highly variable or unknown signal level. The reliability of the signal reception wil then be negatively affected.

Netherlands Patent Application No. 7800249, which has been laid open to public inspection, describes a receiver of the present type in which the two quadrature channels include control amplifiers whose gain factors are controlled via an error-signal amplifier to which the sum of the squares of the output signals of the control amplifiers is applied. This results in signals of controlled amplitude after the control amplifiers. By means of such an automatic gain control, AGC, the dynamic range is reduced, while amplitude variations persist and for reasons of stability the control speed is limited.

SUMMARY OF THE INVENTION

It is an object of the invention to increase the reliability of the signal receiver in changing receiving conditions. The object is to provide a receiver whose output signal is a true image of the frequency deviation of the input signal and independent of amplitude variations over a wide dynamic range despite the absence of a limiter.

According to the invention the receiver for frequency modulated signals is characterized in that divider means are present to divide the amplitude of the signals flowing through the receiving channels to the output of the difference producing means by a factor which is proportional to at least an approximation of the sum of the squares of the output signals of the low-pass filters.

For very weak input signals it will be advantageous to replace the dividing factor by a constant unequal to zero in order to prevent the situation that the amplitude must be divided by zero or by a very small factor.

SHORT DESCRIPTION OF THE FIGURES

FIG. 1 shows a block diagram of a receiver according to the invention.

The other figures show implementations of various types of circuits which are denoted in the block diagram of FIG. 1 by the type indications A, B, C, D and E.

DESCRIPTION OF THE PREFERRED EMBODIMENT

Figure 1:
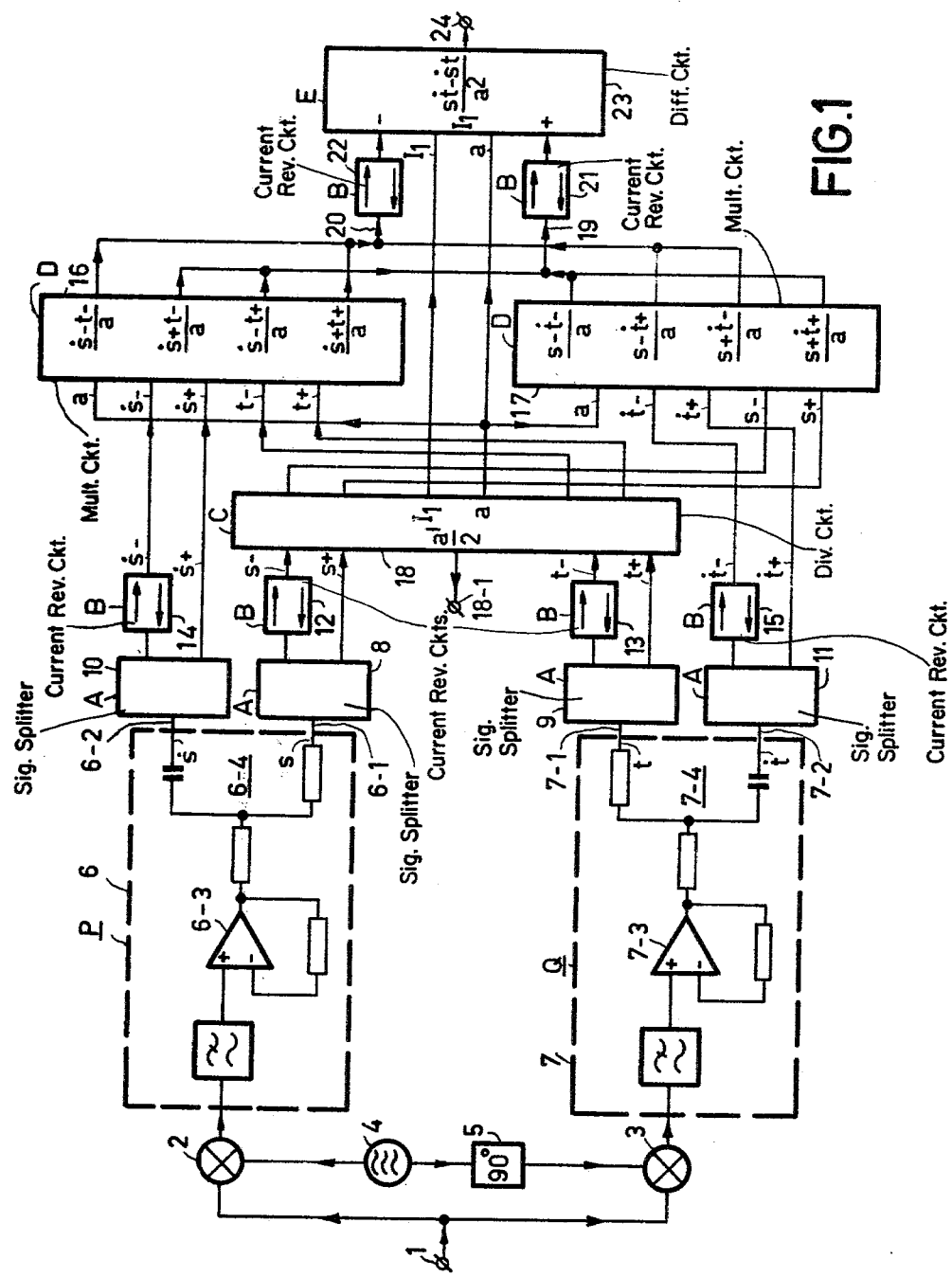

The receiver shown in FIG. 1 comprises two phase quadrature receiving channels which will be called the P-channel and the Q-channel and which are denoted in the Figure by references P and Q.

The input 1 of the receiver is connected to the synchronous demodulators 2 and 3 of the P-channel and the Q-channel. A reference signal produced by a reference signal generator 4 is applied directly to the synchronous demodulator 2 and with a relative phase shift of 90°, produced by a phase shifter 5, to the synchronous demodulator 3.

The synchronous demodulators or mixers 2 and 3 terminate in the low-pass filters 6 and 7. At the outputs 6-1 and 7-1 these filters supply a filtered version of the input signal and at the outputs 6-2 and 7-2 they supply a signal which is equal to the differential (as a function of the time; d/dt) of the output signal at the previously mentioned outputs. The signal at the outputs 6-1 and 7-1, respectively, will be denoted by s and t, respectively, and the signal at the outputs 6-2 and 7-2, respectively, by ṡ and ṫ respectively.

Figure 2:
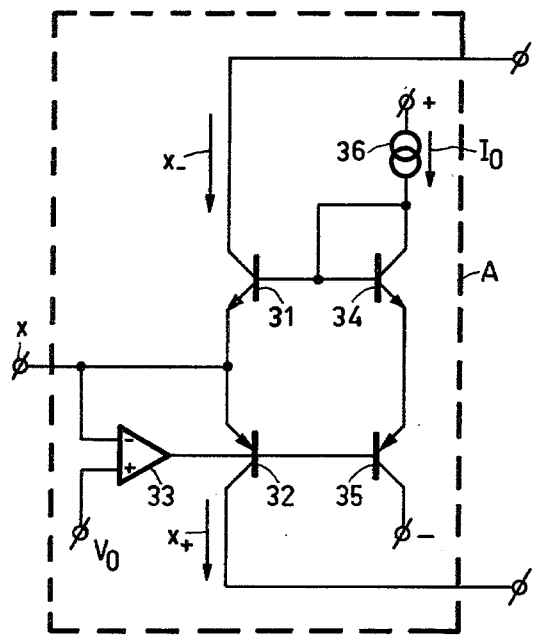
FIG. 2 shows an input circuit (A) for splitting a signal into two components.

The outputs of the filters 6 and 7 are connected to the class-AB input stages 8, 9, 10 and 11 having the type indications A and shown in greater detail in FIG. 2. In such an input stage an input signal x will be split into two components $x_+$ and $x_-$ so that:

$$x = x_+ - x_-, \text{ and}$$

$$x_+ \cdot x_- = I_o^2,$$

wherein $I_o$ is a transistor setting current which may have a relatively low value. For high signal values $x_+$ is substantially equal to the positive portion of the input signal and $x_-$ is substantially equal to the negative portion thereof.

Signal splitting is effected by the transistors 31 and 32 which are controlled by the input signal on their emitters. The operational amplifier 33 whose positive input is connected to a reference voltage $V_o$ keeps the input of the input stage at the reference voltage. This ensures that there is no retro-action of the input stages 8, 9, 10 and 11 on the filters 6 and 7.

Figure 7:
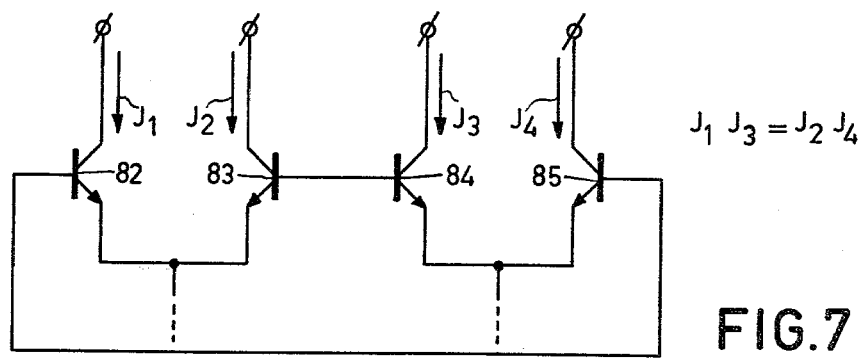
FIG. 7 shows the circuit diagram of the multipliers used in the combinations of the circuits C and D and C and E.

The transistors 34 and 35, through which the current $I_o$ of the constant current source 36 flows, provide two series-arranged base-emitter junctions in parallel with the series arrangement of the base-emitter junctions of the transistors 31 and 32. This configuration results in a ring of four base-emitter junctions, two of which are polarized in one direction and two in the opposite direction. The operation thereof corresponds to that of the ring of four base-emitter junctions of the transistors 82, 83, 84 and 85, shown in FIG. 7, which results in known manner in the expression:

$$J_1 \cdot J_3 = J_2 \cdot J_4,$$

wherein the J's represents the currents through the (identical) transistors having the same temperature. In FIG. 2 the ring of four base-emitter junctions results in the expression:

$$x_+ \cdot x_- = I_o^2.$$

The filters 6 and 7 are identical filters and may, for example, be implemented as active RC filters. In the implementation shown in FIG. 1 the filters have at the outputs fedback operational amplifiers 6-3 and 7-3 which energize parallel RC circuits 6-4 and 7-4. The other side of the resistors and the capacitors are kept at a reference voltage by the input circuits 8-11 of the type A as described above. The current through each of the capacitors will then be equal to the differential of the current through respective resistor, assuming the RC product to be equal to one.

Figure 3:
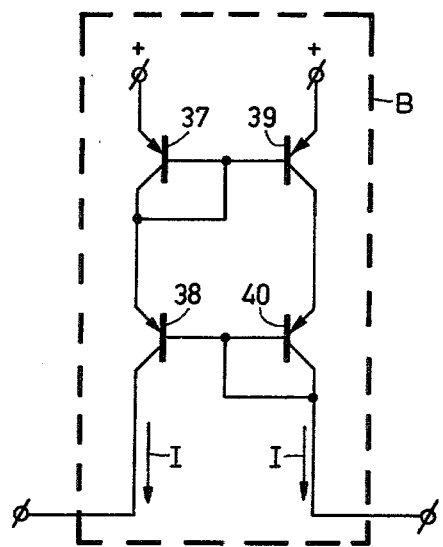
FIG. 3 shows a current reversing circuit (B).

A circuit as shown in FIG. 2 produces at the two outputs, output signals which have opposite current directions. For the through-connection of such circuits to other circuits it may be necessary to reverse the current direction of one of the outputs. For this purpose the circuit diagram of FIG. 1 comprises circuits having the type indication B, which are shown in greater detail in FIG. 3. The transistor 37 which is connected as a diode and is arranged in series with transistor 38 functions as the reference voltage source for transistor 39. Transistor 39 is arranged in series with the transistor 40 which is connected as a diode and ensures that the collector potentials of the transistors 37 and 39 are equal (Early effect). In this circuit the current direction from the input terminal to the output terminal is, in effect, reversed.

Figure 5:
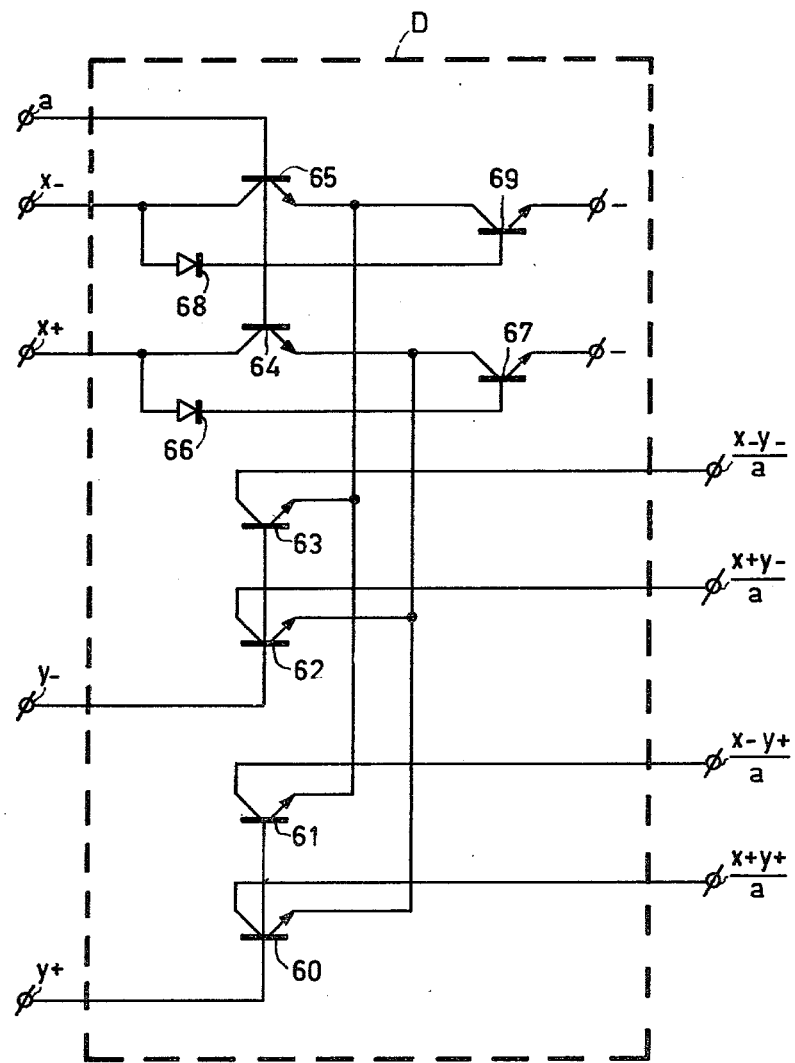
FIG. 5 shows a multiplier (D) which cooperates with a portion of circuit C of FIG. 4.

The output signals of the input circuits 8, 9, 10 and 11 are applied, the current direction having been reversed or not reversed in the current reversing circuits 12, 13, 14 and 15, to the multipliers 16 and 17, which have the type indication D and are shown in greater detail in FIG. 5.

Figure 4:
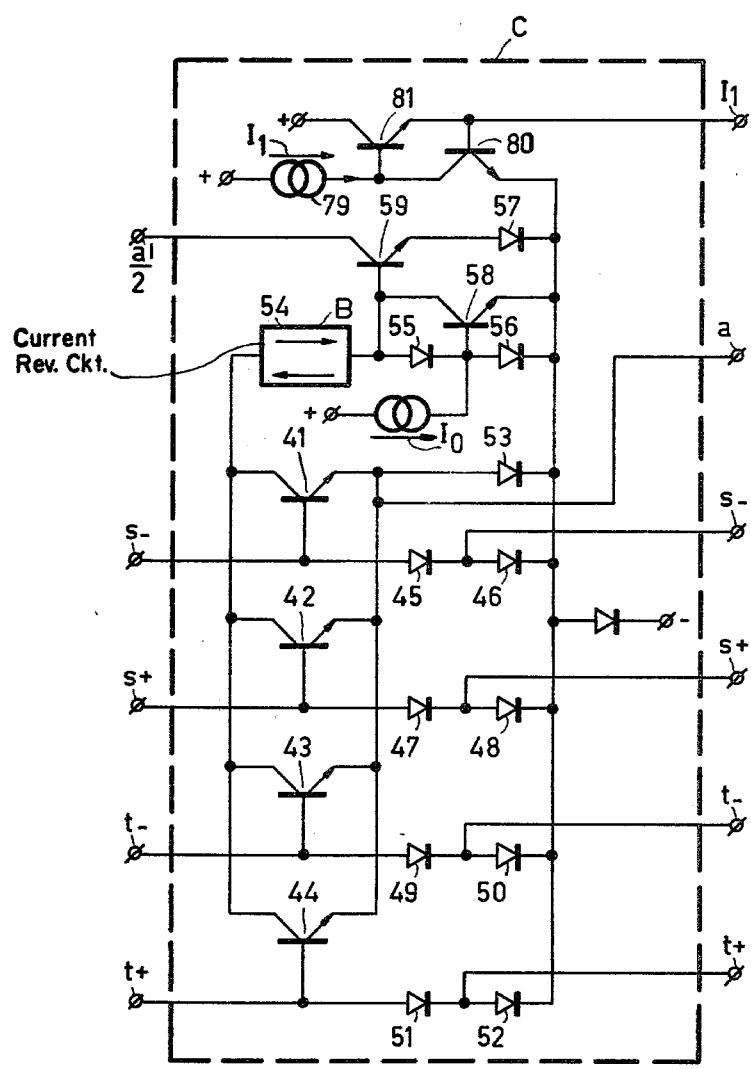
FIG. 4 shows a circuit (C) for determining the root from the sum of squares.

On their way to the multipliers 16 and 17 the output signal $s_-$, $s_+$, $t_-$ and $t_+$ pass through the circuit 18, which has the type indication C and which is shown in greater detail in FIG. 4.

For each one of the input signals, the circuit C comprises a transistor 41, 42, 43, 44 and a pair of series-arranged diodes 45, 46; 47, 48; 49, 50; 51, 52. The transistors have a common emitter lead which includes a diode 53. When all the emitter surface areas are equal the current through diode 53 will have a value a which satisfies the equation:

$$a = \sqrt{s_+^2 + s_-^2 + t_+^2 + t_-^2},$$

which, for higher signal values, is equal to the amplitude of the output signal of the low-pass filters 6 and 7.

The real amplitude a' is expressed by:

$$a' = \sqrt{s_+^2 + s_-^2 + t_+^2 + t_-^2 - 4I_o^2}$$

This function is realized by applying the sum of the collector currents of the transistors 41, 42, 43 and 44 (via the current reversing circuit 54) and the current $I_o$ to the circuit having the diodes 55, 56 and 57 and the transistors 58 and 59. The collector current of transistor 59 will have the value a'/2. The operation is based on the multiplying action in the ring of diodes 55, 56 and 57 and the base-emitter junction of transistor 59 and the fact that current $I_o$ is distributed in equal portions over the diodes 55 and 56, and the distribution in equal portions of the current of circuit 54 over diode 55 and transistor 58. The signal a'/2, produced at output 18-1 of circuit 18, can be used as monitoring signal.

The signal a is applied to the multipliers 16 and 17.

The multiplier 16 produces the terms of the product:

$$\dot{s} \cdot t = (\dot{s}_+ - \dot{s}_-) \cdot (t_+ - t_-)$$

and divides, in conjunction with circuit C each one of the terms by the amplitude factor a.

The multiplier 17 produces the terms of the product:

$$s \cdot \dot{t} = (s_+ - s_-)(\dot{t}_+ - \dot{t}_-)$$

and divides the terms by the amplitude factor a in conjunction with circuit C.

The type D circuit shown in FIG. 5 represents multiplier 16 by the substitution: $x = \dot{s}$ and $y = t$, and represents multiplier 17 by the substitution $x = \dot{t}$ and $y = s$.

For each of the input signals $y_+$ and $y_-$ the circuit D comprises a pair of transistors 60, 61 and 62, 63 which are driven on their bases. Furthermore, the transistors 64 and 65 are provided for the input signals $x_+$ and $x_-$, which transistors are driven by means of diode 66 and transistor 67 and by means of diode 68 and transistor 69 for carrying currents having the values $x_+$ and $x_-$. The bases of the transistors 64 and 65 connect to the diode 53 of circuit C (FIG. 4). By following a signal path from the emitter of one of the transistors 60, 61, 62 and 63 via the base to the input and from there to the similar output of circuit C (FIG. 4) and then via one of the diodes 46, 48, 50 and 52 and thereafter via diode 53 and thereafter via the base-emitter junction of transistor 65 back to the starting point, a ring circuit of four diodes and base-emitter junctions is passed through. The operation thereof corresponds to the operation of the ring circuit of base-emitter junctions shown in FIG. 7. There is a total of four of these ring circuits in accordance with the four outputs of circuit D, and in each ring the relevant transistor of the transistors 60, 61, 62 and 63 carries a current the value of which is indicated in the Figure at the relevant output.

A lead 19 combines the output signals of the multipliers 16 and 17 which are present in the expression:

$$\frac{\dot{s}i - s\dot{t}}{a}$$

with a positive sign and the lead 20 combines the other output signals.

Figure 6:
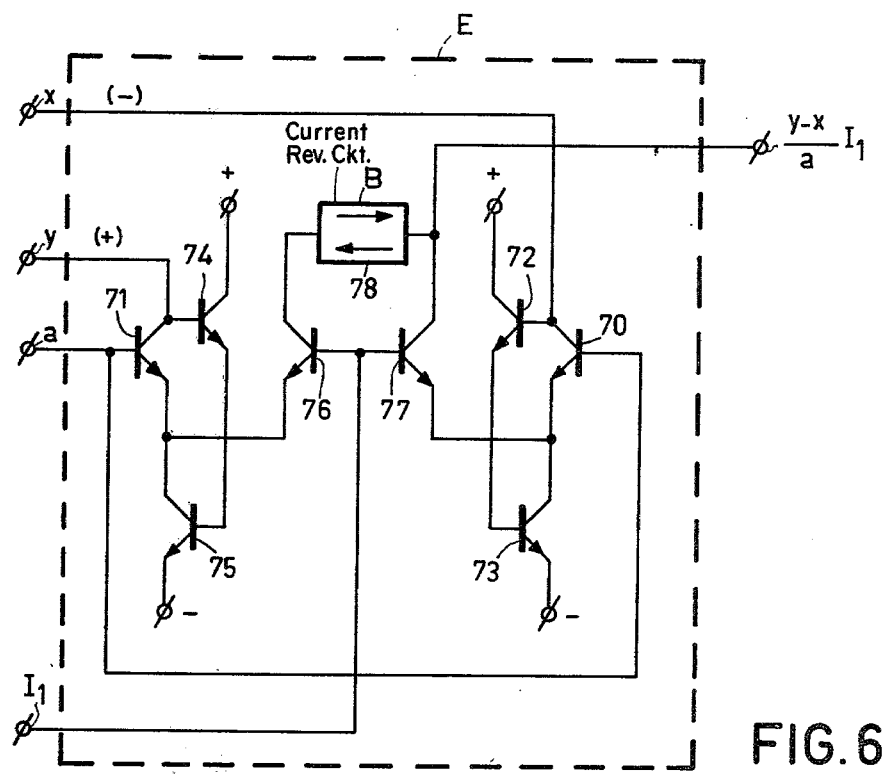
FIG. 6 shows a difference producer (E), which cooperates with a portion of the circuit C shown in FIG. 4.

By means of the reversing circuits 21 and 22 the signals of the leads 19 and 20 are applied to the positive input and the negative input, respectively, of difference producer 23, which has the type indication E and is shown in greater detail in FIG. 6.

The signal a and a signal $I_1$ of circuit 18 is also applied to difference producer 23. From the applied signals difference producer 23 produces in conjunction with circuit 18 an output signal at output 24 in accordance with the expression:

$$I_1 \frac{\dot{s}i - s\dot{t}}{a^2} = I_1 \frac{d(\phi - \omega_o t)}{dt}$$

wherein $\phi = \phi(t)$ denotes the phase of the input signal of the receiver and $\omega_o$ the frequency of the reference signal of reference signal generator 4. The factor $I_1$ is a normalisation factor deviating from zero. When the input signal is a frequency modulated carrier whose phase varies in accordance with the expression:

$$\phi(t) = \omega_o t + \psi(t),$$

a signal is obtained at output 24 which signal corresponds to the expression:

$$I_1 \frac{d\psi(t)}{dt}$$

The output signal of the receiver is independent of the amplitude of the input signal over a wide dynamic range (larger than 50 dB), which range can be realised by implementing all circuits in class −AB.

In FIG. 6 x represents the signal of lead 20 and y the signal of lead 19. For each of the signals x and y the circuit E comprises a transistor 70 and 71, which are driven by means of the transistors 72, 73 and 74, 75 to carry currents having the values x and y. A pair of transistors 76, 77, which are coupled together through a reversing circuit 78, is provided for the input signal $I_1$.

The signal $I_1$ is supplied by circuit C (FIG. 4). This circuit comprises a constant current source 79, which produces the current $I_1$ and a transistor 80, which is controlled by means of transistor 81 for carrying the current $I_1$.

From the base of transistor 76 in circuit E (FIG. 6) a circuit can be traced to the input for signal $I_1$ and from there to the similar output of circuit C (FIG. 4) and then via the base-emitter junction of transistor 80 and thereafter via diode 53 to the output for signal a and back to the similar input of circuit E and then via the base-emitter junction of transistor 71 and thereafter the emitter-base junction of transistor 76 back to the starting point. In this circuit a ring of four diodes and base-emitter junctions is passed through. The operation thereof corresponds to that of the ring of four base-emitter junctions shown in FIG. 7. In the present case transistor 76 will carry a current whose value is given by the expression:

$$\frac{y \cdot I_1}{a}$$

In a corresponding manner a circuit can be traced via the base-emitter junctions of the transistors 77 and 70 (FIG. 6) and the base-emitter junction of transistor 80 and diode 53 (FIG. 4). This results in a current through transistor 77 in accordance with the expression:

$$\frac{x \cdot I_1}{a}$$

The output of the circuit E carries the difference between the currents through the transistors 76 and 77 in accordance with the expression:

$$\frac{(y - x)}{a} I_1$$

which, after substitution of the signal values at the leads 19 and 20 for y and x results in the above-mentioned expression for the signal at output 34 of the receiver.

What is claimed is:

1. A receiver for frequency modulated signals comprising two phase quadrature receiving channels, each of said channels having a synchronous demodulator, a low-pass filter connected to the output of said demodulator, differentiator means coupled to said lowpass filter and multiplying means, in each of said channels said multiplying means being arranged to receive the output of the differentiator of the respective channel and the output of the low-pass filter of the other channel, and difference producing means coupled to both of said multiplying means for producing the difference between the output signals of the multiplying means of the two receiving channels, characterized in that divider means are provided between the outputs of said low-pass filters and said multiplying means for dividing the amplitude of the signals, flowing through the receiving channels to the output of the difference producing means, by a factor which is proportional to at least an approximation of the sum of the squares of the output signals of the low-pass filters.

2. A receiver as claimed in claim 1, characterized in that the divider means are distributed over two stages in each of which the signal of the receiving channel is divided by the square root of said dividing factor.

3. A receiver as claimed in claim 2, characterized in that each stage of the divider means comprises means for generating a current whose value is equal to the quotient of the product of the values of two other currents and the value of a fourth current, the value of the fourth current in each stage being chosen to be equal to said square root of said dividing factor.

* * * * *